United States Patent
Miyamoto et al.

(10) Patent No.: US 7,933,161 B2
(45) Date of Patent: Apr. 26, 2011

(54) MEMORY DEVICE CONFIGURED TO REFRESH MEMORY CELLS IN A POWER-DOWN STATE

(75) Inventors: Hideaki Miyamoto, Ogaki (JP); Shigeharu Matsushita, Katano (JP)

(73) Assignee: Patrenella Capital Ltd., LLC, Wilmington, DE (US)

( * ) Notice: Subject to any disclaimer, the term of this patent is extended or adjusted under 35 U.S.C. 154(b) by 592 days.

(21) Appl. No.: 11/509,057

(22) Filed: Aug. 24, 2006

(65) Prior Publication Data
US 2007/0047363 A1 Mar. 1, 2007

(30) Foreign Application Priority Data
Aug. 24, 2005 (JP) .................................. 2005-241943

(51) Int. Cl.
*G11C 7/20* (2006.01)
(52) U.S. Cl. ........ 365/222; 365/145; 365/229; 365/227; 365/228; 365/230.03; 365/189.05
(58) Field of Classification Search .................. 365/229, 365/227, 228, 222, 145, 230.03, 189.05
See application file for complete search history.

(56) References Cited

U.S. PATENT DOCUMENTS

| | | | | |
|---|---|---|---|---|
| 4,706,215 A | * | 11/1987 | Kirschner et al. | 705/405 |
| 4,979,143 A | * | 12/1990 | Takano et al. | 714/14 |
| 6,967,891 B2 | * | 11/2005 | Nishihara | 365/227 |
| 6,980,459 B2 | * | 12/2005 | Seshadri et al. | 365/145 |
| 2006/0224909 A1 | * | 10/2006 | Do | 713/323 |
| 2007/0006150 A9 | * | 1/2007 | Walmsley | 717/120 |

FOREIGN PATENT DOCUMENTS

| | | |
|---|---|---|
| JP | 7-73682 A | 3/1995 |
| JP | 2000-011665 | 1/2000 |
| JP | 2003-007051 | 1/2003 |

OTHER PUBLICATIONS

Machine translation of JP 2000-11665A, published Jan. 14, 2000.*
English translation of First Office Action received in Chinese Patent Application No. 200610121356.6 mailed Jul. 3, 2009.
Notification of Completion of Formalities for Registration and Notification for the Grant of Invention Patent Right and mailed Dec. 18, 2009 in Chinese Patent Application No. 200610121356.6.
Office Action mailed Dec. 28, 2009 for Japanese Patent Application No. 2005-241943.

* cited by examiner

*Primary Examiner* — Andrew Q Tran
(74) *Attorney, Agent, or Firm* — Schwabe, Williamson & Wyatt, P.C.

(57) ABSTRACT

A memory capable of preventing a memory cell from disappearance of data resulting from accumulated disturbances is obtained. This memory comprises a nonvolatile memory cell and a refresh portion for rewriting data in the memory cell. The refresh portion reads data from and rewrites data in the memory cell in a power-down state.

23 Claims, 5 Drawing Sheets

MEMORY DEVICE CONFIGURED TO REFRESH MEMORY CELLS IN A POWER-DOWN STATE

BACKGROUND OF THE INVENTION

1. Field of the Invention

The present invention relates to a memory, and more particularly, it relates to a memory comprising a refresh portion for reading and rewriting data from and in memory cells.

2. Description of the Background Art

In relation to a ferroelectric memory, a disturbance is generally known as such a phenomenon that data disappear due to reduction in the quantities of polarization of ferroelectric capacitors resulting from application of a prescribed voltage to memory cells connected to word lines other than a selected word line in a rewrite operation after a read operation and a write operation on the memory cells including the ferroelectric capacitors. A ferroelectric memory comprising a refresh portion for rewriting data in memory cells including ferroelectric capacitors and a counter for detecting access frequencies with respect to the memory cells in order to suppress such a disturbance is known in general, as disclosed in Japanese Patent Laying-Open No. 7-73682 (1995), for example.

When the access frequencies with respect to the memory cells detected by the counter reach a prescribed number of times, the conventional ferroelectric memory disclosed in the aforementioned Japanese Patent Laying-Open No. 7-73682 responsively forcibly rewrites data in the memory cells with the refresh portion, thereby suppressing a disturbance resulting from reduction in the quantities of polarization of the ferroelectric capacitors.

When the conventional ferroelectric memory disclosed in the aforementioned Japanese Patent Laying-Open No. 7-73682 is brought into a power-down state before the access frequencies with respect to the memory cells reach the prescribed number of times for the refresh operation, however, the data of the access frequencies detected by the counter may disappear before the ferroelectric memory performs the refresh operation. When the ferroelectric memory is repetitively subjected to a power-down operation before the access frequencies reach the prescribed number of times and a subsequent power-up operation in this case, disturbances resulting from access operations performed before the power-down operation are so accumulated in the memory cells that the data of the memory cells may disadvantageously disappear due to the accumulated disturbances.

SUMMARY OF THE INVENTION

The present invention has been proposed in order to solve the aforementioned problem, and an object of the present invention is to provide a memory capable of preventing a memory cell from disappearance of data resulting from accumulated disturbances.

In order to attain the aforementioned object, a memory according to an aspect of the present invention comprises a nonvolatile memory cell and a refresh portion for rewriting data in the memory cell. The refresh portion reads and rewrites data from and in the memory cell in a power-down state.

The memory according to this aspect, reading and rewriting data from and in the memory cell with the refresh portion in the power-down state as hereinabove described, can refresh the memory cell every power-down operation. Also when the memory is repetitively subjected to a power-down operation before an access frequency with respect to the memory cell reaches a prescribed number of times and a subsequent power-up operation, therefore, the memory cell can be prevented from accumulation of disturbances resulting from access operations performed before the power-down operation. Consequently, the memory cell can be prevented from disappearance of data resulting from accumulated disturbances.

The memory according to the aforementioned aspect preferably further comprises a power-down detecting portion detecting a power-down state, and the refresh portion preferably reads and rewrites data from and in the memory cell when the power-down detecting portion detects the power-down state. According to this structure, the memory can easily read and rewrite data from and in the memory cell with the refresh portion in the power-down state.

In the aforementioned structure comprising the power-down detecting portion, the power-down detecting portion is preferably so formed as to output an activation signal for driving the refresh control portion to the refresh control portion by detecting the power-down state. According to this structure, the memory can easily read and rewrite data from and in the memory cell when the power-down detecting portion detects the power-down state.

The memory according to the aforementioned aspect preferably further comprises a row decoder for driving a word line, and the refresh portion is preferably so formed as to output a control signal for starting a refresh operation consisting of a read operation and a rewrite operation on the memory cell to the row decoder in the power-down state. According to this structure, the memory can easily read and rewrite data from and in the memory cell with the refresh portion and the row decoder in the power-down state.

The memory according to the aforementioned aspect preferably generates a power-down signal and inputs the power-down signal in the refresh portion in response to the power-down state, and the refresh portion preferably reads and rewrites data from and in the memory cell on the basis of the power-down signal. According to this structure, the memory can read and rewrite data from and in the memory cell with the refresh portion in the power-down state without a circuit for detecting the power-down state, whereby the circuit structure of the memory can be simplified.

The memory according to the aforementioned aspect preferably further comprises a first frequency detecting portion detecting an access frequency with respect to the memory cell, and the refresh portion preferably reads and rewrites data from and in the memory cell when at least the first frequency detecting portion detects that the total access frequency with respect to the memory cell has reached a prescribed number of times in said power-down state. According to this structure, the memory can read and rewrite data from and in the memory cell also when at least the first frequency detecting portion detects that the total access frequency with respect to the memory cell has reached the prescribed number of times in the power-down state. Thus, the memory can further reliably suppress disappearance of data resulting from a disturbance.

The memory according to the aforementioned aspect is preferably provided with a plurality of memory cells and preferably further comprises a memory cell array including a plurality of memory cell blocks each having the plurality of memory cells and an access operation detecting portion detecting an access operation every prescribed number of memory cells, while the refresh portion preferably reads and rewrites data from and in the memory cells included in at least one memory cell block possessing the prescribed number of memory cells at least on the basis of a result of detection of the access operation detecting portion in the power-down state.

According to this structure, the memory can restrictively read and rewrite data from and in the memory cells provided in the memory cell block possessing the prescribed number of memory cells, thereby reducing the frequency of disturbances caused in already read and rewritten (refreshed) memory cells due to disturbances resulting from refresh operations of other memory cells as compared with a case of sequentially reading and rewriting data from and in all memory cells included in the memory cell array. Thus, the frequency of disturbances caused in the memory cells in the refresh operation can be reduced.

In this case, the access operation detecting portion preferably includes a first holding portion holding presence/absence of an access operation every memory cell block, and the refresh portion preferably reads and rewrites data from and in the memory cells included in at least one memory cell block when at least the first holding portion holds presence of an access operation with respect to the corresponding memory cell block in the power-down state. According to this structure, the memory can easily restrictively rewrite data in the memory cells provided in the memory cell block subjected to an access operation, thereby easily reducing the frequency of disturbances caused in the memory cells in the refresh operation.

In the aforementioned memory including the first holding portion, the first holding portion is preferably provided every memory cell block. According to this structure, the memory can easily select the memory cell block subjected to an access operation on the basis of the first holding portion.

In the aforementioned structure including the access operation detecting portion, the access operation detecting portion preferably includes a second frequency detecting portion detecting an access frequency every memory cell block, and the refresh portion preferably reads and rewrites data from and in the memory cells included in at least one memory cell block when at least the second frequency detecting portion detects that the access frequency with respect to the corresponding memory cell block has reached a prescribed number of times in the power-down state. According to this structure, the memory cell can easily select and refresh a memory cell block requiring a refresh operation due to the access frequency reaching the prescribed number of times.

In the aforementioned structure including the access operation detecting portion, the memory preferably further comprises a plurality of word lines connected with the prescribed number of memory cells respectively, the access operation detecting portion preferably includes a second holding portion holding presence/absence of an access operation every word line, and the refresh portion preferably reads and rewrites data from and in the memory cells included in the memory cell block corresponding to at least one word line when at least the second holding portion holds presence of an access operation with respect to the corresponding word line in the power-down state. According to this structure, the memory can restrictively read and rewrite data from and in the memory cells provided in the memory cell block corresponding to the accessed word line subjected to an access operation, thereby easily reducing the frequency of disturbances caused in the memory cells in the refresh operation.

In the aforementioned structure having the access operation detecting portion including the second holding portion holding presence/absence of the access operation every word line, the second holding portion is preferably provided every word line. According to this structure, the memory can easily select the memory cell block corresponding to the word line subjected to the access operation on the basis of the second holding portion.

In the aforementioned structure having the access operation detecting portion including the second holding portion holding presence/absence of the access operation every word line, the memory preferably further comprises a second frequency detecting portion detecting an access frequency every memory cell block, for changing all second holding portions corresponding to at least one memory cell block to states holding absence of access operations if all second holding portions corresponding to at least one memory cell block hold presence of access operations when the second frequency detecting portion detects that an access frequency with respect to at least one memory cell block has reached a prescribed number of times, and the refresh portion preferably neither reads nor rewrites data from or in the memory cells included in at least one memory cell block when all second holding portions corresponding to at least one memory cell block hold absence of access operations. According to this structure, the memory can rewrite no data in a memory cell block conceivably not much influenced by disturbances due to access operations relatively uniformly performed on the memory cells through all corresponding word lines. Thus, the memory can reduce the frequency for reading and rewriting data through the refresh operation, thereby reducing the frequency of disturbances caused in the memory cells in the refresh operation also according to this structure.

In this case, the refresh portion may read and rewrite data from and in the memory cells included in at least one memory cell block if the second holding portions corresponding to at least one memory cell block include both of the second holding portion holding presence of an access operation and the second holding portion holding absence of an access operation when the second frequency detecting portion detects that an access frequency with respect to at least one memory cell block has reached a prescribed number of times.

In the aforementioned structure changing all second holding portions corresponding to at least one memory cell block to states holding absence of access operations if all second holding portions corresponding to at least one memory cell block hold presence of access operations, the second frequency detecting portion is preferably provided every memory cell block. According to this structure, the memory can easily detect the access frequency every memory cell block with the second frequency detecting portion.

In the memory according to the aforementioned aspect, the memory cell may include a ferroelectric capacitor having a ferroelectric film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. The following embodiments of the present invention are applied to ferroelectric memories employed as exemplary memories according to the present invention.

First Embodiment

The structure of a ferroelectric memory according to a first embodiment of the present invention is now described with reference to FIGS. 1 to 4.

Figure 1:
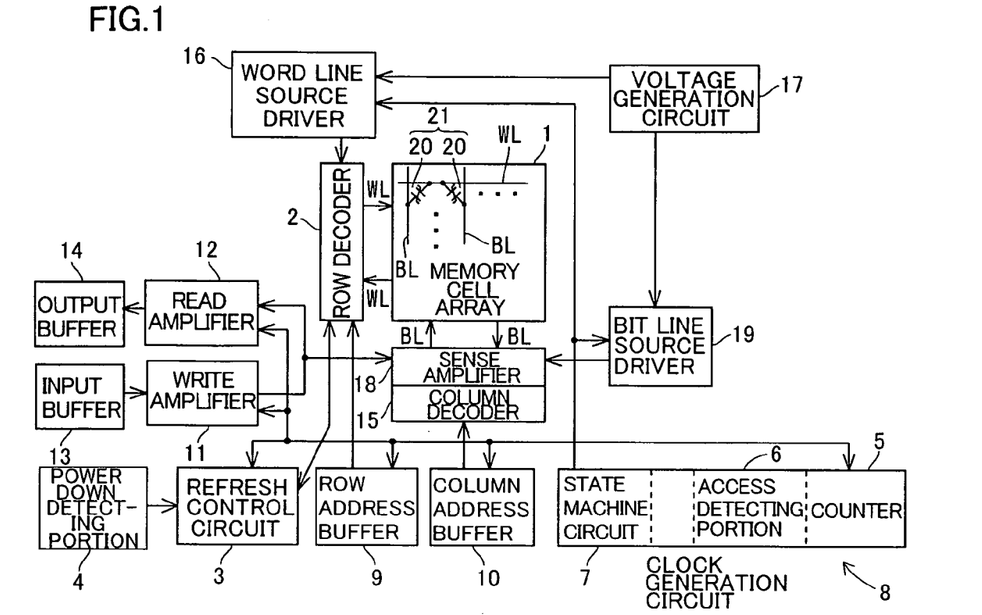
FIG. 1 is a block diagram for illustrating the overall structure of a ferroelectric memory according to a first embodiment of the present invention.

As shown in FIG. 1, the ferroelectric memory according to the first embodiment comprises a memory cell array 1, a row decoder 2 for driving word lines, a refresh control circuit 3, a power-down detecting portion 4, a clock generation circuit 8 including a counter 5, an access detecting portion 6 and a state machine circuit 7, a row address buffer 9, a column address buffer 10, a write amplifier 11, a read amplifier 12, an input buffer 13, an output buffer 14, a column decoder 15, a word line source driver 16, a voltage generation circuit 17, a sense amplifier 18 and a bit line source driver 19. The refresh control circuit 3 is an example of the "refresh portion" in the present invention, and the counter 5 is an example of the "first frequency detecting portion" in the present invention.

Figure 2:
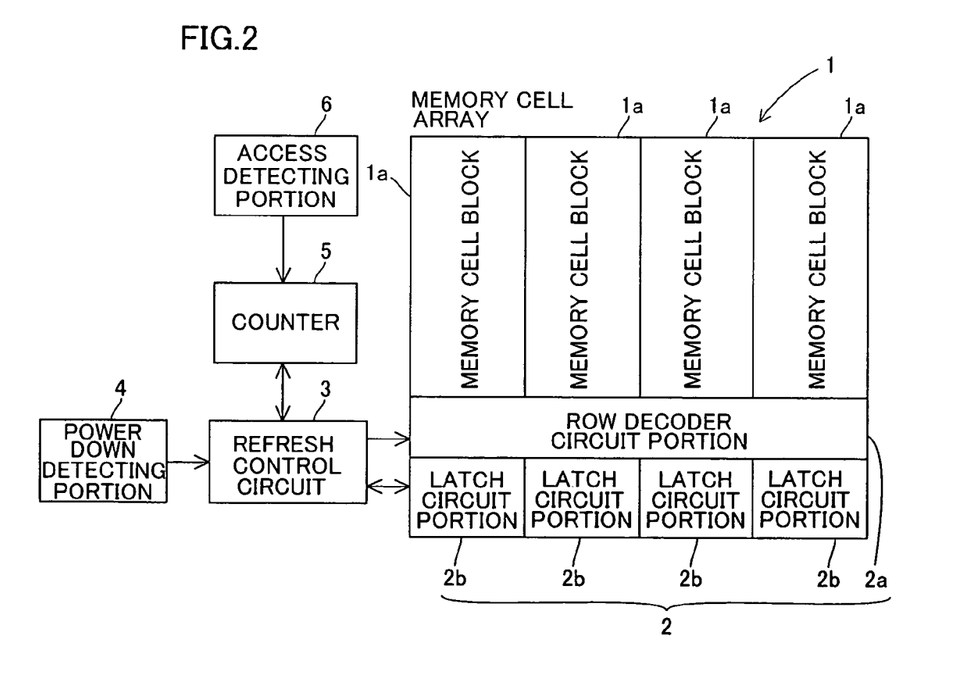
FIG. 2 is a block diagram for illustrating the detailed structure of the ferroelectric memory according to the first embodiment shown in FIG. 1.
Figure 3:
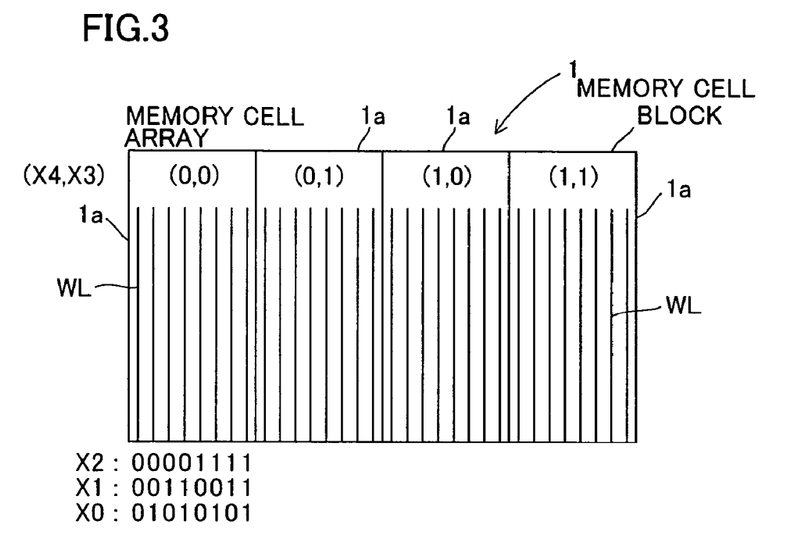
FIG. 3 is a diagram for illustrating the structure of a memory cell array of the ferroelectric memory according to the first embodiment shown in FIG. 1.

In the memory cell array 1, a plurality of word lines WL and a plurality of bit lines BL are arranged to intersect with each other while ferroelectric capacitors 20 are arranged on the intersections thereof respectively. The ferroelectric capacitors 20 include ferroelectric films (not shown) arranged between the word lines WL and the bit lines BL. Each pair of ferroelectric capacitors 20 constitute each memory cell 21. The memory cell array 1 is constituted of four memory cell blocks 1a, as shown in FIG. 2. Each memory cell block 1a includes eight word lines WL and a plurality of memory cells 21 (see FIG. 1) connected to the word lines WL, as shown in FIG. 3.

Prescribed row addresses are allotted to the memory cell blocks 1a and the word lines WL respectively. More specifically, a row address expressed as (X4,X3) is allotted to each memory cell block 1a as shown in FIG. 3, while a row address expressed (X2,X1,X0) is allotted to each word line WL. Thus, each word line WL included in each memory cell block 1a has a row address expressed as (X4,X3,X2,X1,X0). The four memory cell blocks 1a have row addresses (0,0), (0,1), (1,0) and (1,1) as the row addresses (X4,X3) respectively. The eight word lines WL have row addresses (0,0,0), (0,0,1), (0,1,0), (0,1,1), (1,0,0), (1,0,1), (1,1,0) and (1,1,1) as the row addresses (X2,X1,X0) respectively.

The row decoder 2 is connected to the word lines WL, as shown in FIG. 1. This row decoder 2 is constituted of a row decoder circuit portion 2a connected to the word lines (WL) (see FIG. 1) and four latch circuit portions 2b, as shown in FIG. 2. The latch circuit portions 2b are examples of the "first holding portion" in the present invention.

According to the first embodiment, the latch circuit portions 2b are provided in correspondence to the memory cell blocks 1a respectively. These latch circuit portions 2b have a function of holding presence/absence of read and rewrite operations or write operations (hereinafter referred to as access operations) for the corresponding memory cell blocks 1a respectively. More specifically, each latch circuit portion 2b is so formed as to hold high-level data when the corresponding memory cell block 1a is accessed while holding low-level data when the corresponding memory cell block 1a is not accessed. The refresh control circuit 3 for controlling refresh operations on the memory cells 21 is connected to the row decoder 2, while the power-down detecting portion 4 and the counter 4 of the clock generation circuit 8 are connected to the refresh control circuit 3.

Figure 4:
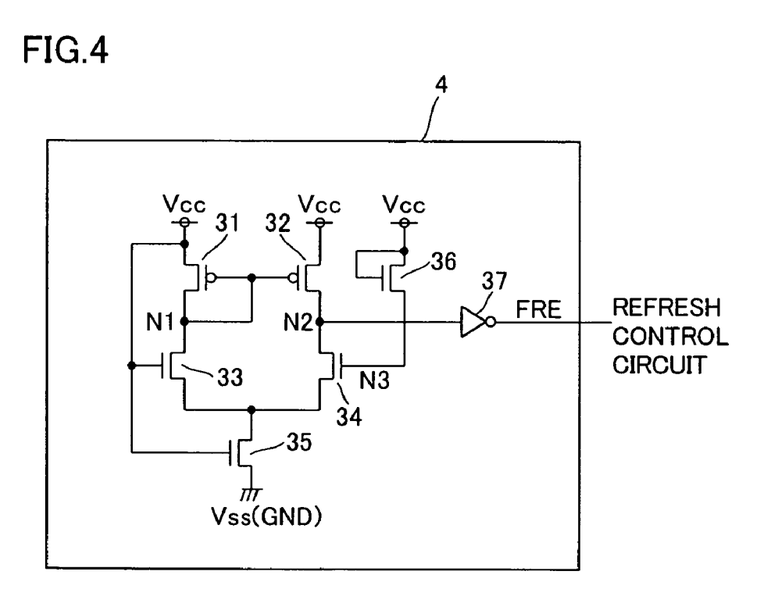
FIG. 4 is a circuit diagram for illustrating the structure of a power-down detecting portion of the ferroelectric memory according to the first embodiment shown in FIG. 1.

According to the first embodiment, the power-down detecting portion 4 is so formed as to output an activation signal FRE for driving the refresh control circuit 3 by detecting a power-down state. More specifically, the power-down detecting portion 4 is constituted of two p-channel transistors 31 and 32, four n-channel transistors 33 to 36 and an inverter circuit 37, as shown in FIG. 4. The p-channel transistor 31 has a source supplied with a power supply voltage (0 V to Vcc) and a drain connected with the drain of the n-channel transistor 33. The gates of the p-channel transistors 31 and 32 are connected with each other, and further connected to a node N1 between the p- and n-channel transistors 31 and 33. The p-channel transistor 32 has a source supplied with the power supply voltage (0 V to Vcc) and a drain connected with the drain of the n-channel transistor 34.

The sources of the n-channel transistors 33 and 34 are connected to the drain of the n-channel transistor 35. The gates of the n-channel transistors 33 and 35 are supplied with the power supply voltage (0 V to Vcc). The source of the n-channel transistor 35 is grounded and supplied with a potential Vss (ground potential GND). The source of the n-channel transistor 36 is connected to the gate of the n-channel transistor 34. The gate and the drain of the n-channel transistor 36 are connected with each other, and supplied with the power supply voltage (0V to Vcc). A node N2 between the p- and n-channel transistors 32 and 34 is connected to an input side of the inverter circuit 37. The inverter circuit 37 outputs the activation signal FRE for driving the refresh control circuit 3 (see FIG. 1) from an output side thereof.

The counter (see FIG. 2) is so formed as to detect access frequencies (frequencies of read and rewrite operations and write operations) with respect to all memory cells 21 (see FIG. 1) included in the memory cell array 1 and to output a prescribed signal to the refresh control circuit 3 when any of the access frequencies has reached a prescribed number of times. The refresh control circuit 3 is so formed as to output a control signal for starting a refresh operation to the row decoder 2 when receiving the activation signal FRE from the power-down detecting portion 4 in the power-down state and when receiving the prescribed signal from the counter 5 detecting that the access frequencies with respect to all memory cells 21 has reached the prescribed number of times.

The access detecting portion 6 of the clock generation circuit 8 (see FIG. 1) is provided for detecting access operations with respect to the memory cells 21. The counter 5 is so formed as to increase the access frequencies by +1 when the access detecting portion 6 detects access operations with respect to the memory cells 21.

The counter 5 is connected to the row address buffer 9, the column address buffer 10, the write amplifier 11 and the read amplifier 12, as shown in FIG. 1. The input and output buffers 13 and 14 are connected to the write and read amplifiers 11 and 12 respectively. The row and column address buffers 9 and 10 are connected to the row and column decoders 2 and 15 respectively. The word line source driver 16 is connected to the row decoder 2, while the voltage generation circuit 17 and the state machine circuit 7 of the clock generation circuit 8 are connected to the word line source driver 16. The column decoder 15 is connected to the bit lines BL of the memory cell array 1 through the sense amplifier 18. The write and read amplifiers 11 and 12 and the bit line source driver 19 are connected to the sense amplifier 18, while the voltage generation circuit 17 and the state machine circuit 7 are connected to the bit line source driver 19.

Operations of the ferroelectric memory according to the first embodiment of the present invention are now described with reference to FIGS. 1 to 5.

In order to use the ferroelectric memory according to the first embodiment, power is so supplied as to bring the ferroelectric memory into a power-up state. According to the first embodiment, the counter 5 (see FIG. 2) is so reset in the power-up state that the count thereof is "0". Further, all latch circuit portions 2b corresponding to the memory cell blocks 1a are so reset as to hold low-level data (reset states). Thereafter access operations with respect to the memory cells 21 (see FIG. 1) are started. At this time, the access detecting portion 6 detects access operations with respect to all memory cells 21. The counter 5 increases the corresponding access frequency by +1 every time the access detecting portion 6 detects an access operation. Thus, the counter 5 detects the access frequencies with respect to all memory cells 21 in the memory cell array 1.

When an access operation with respect to certain memory cells 21 includes read and rewrite operations, the row decoder 2 selects a word line WL (see FIG. 1) corresponding to a row address externally input in the ferroelectric memory. Thus, the sense amplifier 18 collectively reads data from the plurality of memory cells 21 connected to the selected word line WL through the corresponding bit lines BL, and amplifies the data. The data amplified by the sense amplifier 18 are read out from the ferroelectric memory through the read amplifier 12 and the output buffer 14. Thereafter the ferroelectric memory rewrites the data read by the sense amplifier 18 in the memory cells 21 from which the data have been read. When the access operation with respect to the memory cells 21 is a write operation, on the other hand, the sense amplifier 18 reads data from the plurality of memory cells 21 connected to the selected word line WL similarly to the case of the aforementioned read operation, and thereafter rewrites data externally input in the ferroelectric memory in place of the read data. Thereafter the sense amplifier 18 writes the rewritten data in the memory cells 21.

In the aforementioned rewrite operation after the read operation and the aforementioned write operation, the ferroelectric memory applies a prescribed voltage (½ Vcc or ⅓ Vcc) to memory cells 21 connected to word lines WL (hereinafter referred to as nonselected word lines WL) other than the selected word line WL in the memory cell block 1a corresponding to the selected word line WL. Thus, the quantities of polarization of the ferroelectric capacitors 20 are reduced in the memory cells 21 connected to the nonselected word lines WL in the memory cell block 1a corresponding to the selected word line WL, to cause disturbances. In the aforementioned access operation, the latch circuit portion 2b corresponding to the accessed memory cell block 1a holds high-level data, while latch circuit portions 2b corresponding to the unaccessed memory cell blocks 1a holds low-level data.

When detecting that the access frequencies with respect to all memory cells 21 have reached the prescribed number of times, the counter 5 outputs a prescribed signal to the refresh control circuit 3 in the ferroelectric memory according to the first embodiment. The refresh control circuit 3 receiving this signal from the counter 5 outputs the control signal for starting a refresh operation to the row decoder 2. According to the first embodiment, the refresh control circuit 3 outputs a row address for selecting a word line WL requiring a refresh operation to the row decoder circuit portion 2a on the basis of the data held in the latch circuit portions 2b at this time. When any latch circuit portion 2b holds high-level data, the refresh control circuit 3 outputs the row address of any word line WL included in the memory cell block 1a corresponding to this latch circuit 2b. When the latch circuit portion 2b holds low-level data, however, the refresh control circuit 3 outputs no row addresses of the word lines WL included in the memory cell block 1a corresponding to the latch circuit portion 2b.

It is assumed that the memory cell blocks 1a having the row addresses (0,0), (1,0) and (1,1) are accessed while the memory cell block 1a having the row address (0,1) is not accessed in the memory cell array 1 shown in FIG. 3, for example. In this case, the latch circuit portions 2b (see FIG. 2) corresponding to the memory cell blocks 1a of the row addresses (0,0), (1,0) and (1,1) hold low-level data, while the latch circuit portion 2b (see FIG. 2) corresponding to the memory cell block 1a of the row address (0,1) holds low-level data. At this time, the refresh control circuit 3 (see FIG. 2) sequentially outputs row addresses (0,0,0,0,0) to (0,0,1,1,1) corresponding to the word lines WL included in the memory cell block 1a having the row address (0,1) to the row decoder circuit portion 2a, while outputting no row addresses (0,1,0,0,0) to (0,1,1,1,1) corresponding to the word lines WL included in the memory cell block 1a having the row address (0,1). After outputting the row address (0,0,1,1,1), therefore, the refresh control circuit 3 sequentially outputs row addresses (1,0,0,0,0) to (1,0,1,1,1) and (1,1,0,0,0) to (1,1,1,1,1) corresponding to the word lines WL included in the memory cell blocks 1a having the row addresses (1,0) and (1,1).

The row decoder circuit portion 2a selects the word lines WL in the order of the row addresses received from the refresh control circuit 3 as described above, and the sense amplifier 18 reads and amplifies data of the memory cells 21 connected to the selected word lines WL respectively. Thereafter the ferroelectric memory rewrites the same data as those read by the sense amplifier 18 in the memory cells 21. Therefore, the ferroelectric memory reads and rewrites data from and in the memory cells 21 connected to the word lines WL having the row addresses (0,0,0,0,0) to (0,0,1,1,1), (1,0,0,0,0) to (1,0,1,1,1) and (1,1,0,0,0) to (1,1,1,1,1) output from the refresh control circuit 3 to the row decoder circuit portion 2a, while reading and rewriting no data from and in the memory cells 21 connected to the word lines WL of the eight row addresses (0,1,0,0,0) to (0,1,1,1,1) not output from the refresh control circuit 3 to the row decoder circuit portion 2a. Thus, the ferroelectric memory reads and rewrites data from and in all memory cells 21 included in the accessed memory cell blocks 1a of the addresses (0,0), (1,0) and (1,1), while reading and rewriting no data from and in all memory cells 21 included in the unaccessed memory cell block 1a of the row address (0,1). The ferroelectric memory refreshes the memory cells 21 after the prescribed number of access operations in the aforementioned manner.

In the read and rewrite operations through the refresh operation, the ferroelectric memory applies the prescribed voltage (½ Vcc or ⅓ Vcc) to the memory cells 21 connected to the nonselected word lines WL in the memory cell block 1a corresponding to the selected word line WL, to cause disturbances due to reduction in the quantities of polarization of the ferroelectric capacitors 20. Upon completion of a refresh operation after the prescribed number of access operations, the counter 5 is so reset that the count thereof is "0", while all latch circuit portions 2b are also reset to hold low-level data. Thereafter the ferroelectric memory repetitively performs the aforementioned operations.

Figure 5:
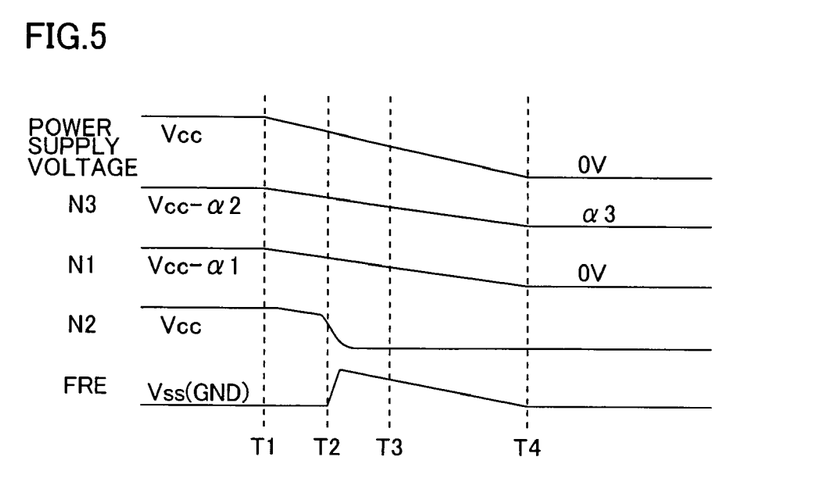
FIG. 5 is a voltage waveform diagram for illustrating operations of the power-down detecting portion of the ferroelectric memory according to the first embodiment shown in FIG. 1.

According to the first embodiment, the ferroelectric memory refreshes all memory cells 21 (see FIG. 1) in the power-down state. More specifically, the power-down detecting portion 4 (FIG. 4) is supplied with the power supply voltage Vcc in an initial state (precedent to T1) before the start of a power-down operation, as shown in FIG. 5. Thus, the n-channel transistors 33, 35 and 36 supplied with the power supply voltage in the gates thereof are in ON-states. The p-channel transistors 31 and 32, having a gate-to-source voltage VGS (potential of node N1--power supply voltage Vcc) lower than the threshold voltage Vth thereof, are also in ON-states. The current potential of the node N1 is Vcc−α1, due to resistance division between the p-channel transistor 31 and the n-channel transistors 33 and 35. Further, the potential of a node N3 input in the gate of the n-channel transistor 34 is Vcc−α2, due to a threshold voltage drop caused by the n-channel transistor 36. Thus, the gate potential (Vcc−α2) of the n-channel transistor 34 is lower than the gate potential (power supply voltage Vcc) of the n-channel transistor 34, whereby the resistance of the n-channel transistor 34 exceeds that of the n-channel transistor 33. Therefore, the potential of the node N2 decided by resistance division between the p-channel transistor 32 and the n-channel transistors 34 and 35 exceeds the potential of the node N1 decided by resistance division between the p-channel transistor 31 and the n-channel transistors 33 and 35, to substantially reach Vcc.

In the power-down state, the power supply voltage gradually lowers from Vcc to 0 V. Thus, the potential of the node N1 also gradually lowers from Vcc−α1 to 0 V. At this time, the potential of the node N1 more slowly lowers as compared with the power supply voltage. In other words, the ON-states of the n-channel transistors 33 and 35 are weakened as the power supply voltage lowers, to increase the resistance of the n-channel transistors 33 and 35. Thus, the potential of the node N1 decided by resistance division between the p-channel transistor 31 and the n-channel transistors 33 and 35 more slowly lowers as compared with the power-supply voltage due to the increased resistance of the n-channel transistors 33 and 35.

Further, the potential of the node N3 also gradually lowers from Vcc−α2 to a level a3 following reduction of the power supply voltage from Vcc. At this time, the potential of the node N3 more slowly lowers as compared with the power supply voltage. In other words, the gate-to-source voltage $V_{GS}$ of the n-channel transistor 36 reduces as the power supply voltage lowers from Vcc, so that the n-channel transistor 36 approaches an OFF-state. Thus, the resistance of the n-channel transistor 36 is increased to reduce a current flowing through the n-channel transistor 36. Therefore, the potential of the node N3 linked to the source of the n-channel transistor 36 more slowly lowers as compared with the power supply voltage.

The power supply voltage and the potential of the node N3 are equalized to each other at a time T2 shown in FIG. 5. Thus, the potential of the node N3 exceeds the power supply voltage after T2. Therefore, the resistance of the n-channel transistor 34 having the gate connected to the node N3 is reduced below that of the n-channel transistor 33 having the gate supplied with the power supply voltage. Thus, the potential of the node N2 decided by resistance division between the p-channel transistor 32 and the n-channel transistors 34 and 35 is reduced below that of the node N1 decided by resistance division between the p-channel transistor 31 and the n-channel transistors 33 and 35. Therefore, the potential of the node N2 falls to about Vss after T2. In response to this fall of the potential of the node N2 to about Vss, the potential of the activation signal FRE output from the inverter circuit 37 having the input side connected to the node N2 rises to Vcc. The activation signal FRE of Vcc is input in the refresh control circuit 3 (see FIG. 2).

After the time T3 shown in FIG. 5, the respective portions of the ferroelectric memory are hard to normally operate due to the reduction of the power supply voltage. Therefore, the ferroelectric memory must complete the refresh operation in the power-down state before the time T3 through all word lines WL (see FIG. 1). The period between T2 and T3 shown in FIG. 5 is at least several 100 µs. Assuming that a cycle time necessary for a refresh operation through a single word line WL is 50 ns and the ferroelectric memory performs a refresh operation through 512 word lines WL, the time necessary for refreshing all memory cells 21 is 25.6 µs (=50 ns by 512). Therefore, the ferroelectric memory can sufficiently complete the refresh operation through the 512 word lines WL in the period (at least several 100 µs) between T2 and T3. In other words, the ferroelectric memory can complete the refresh operation through the 512 word lines WL before the respective portions thereof do not normally operate in the power-down state.

When receiving the activation signal FRE of Vcc from the power-down detecting portion 4, the refresh control circuit 3 outputs the control signal for starting the refresh operation on all memory cells 21 (see FIG. 1) to the row decoder 2. At this time, the refresh control circuit 3 sequentially outputs all row addresses (0,0,0,0,0) to (1,1,1,1,1) (see FIG. 3) to the row decoder circuit portion 2a. Thus, the ferroelectric memory sequentially refreshes all memory cells 21 provided in the memory cell array 1. At this time, the ferroelectric memory refreshes the memory cells 21 by reading and rewriting data from and in the memory cells 21 in this power-down state, similarly to the aforementioned refresh operation performed in response to the access frequencies reaching the prescribed number of times.

According to the first embodiment, as hereinabove described, the ferroelectric memory can refresh all memory cells 21 every power-down operation by reading and rewriting data from and in all memory cells 21 with the refresh control circuit 3 in the power-down state. Thus, the memory cells 21 can be prevented from accumulation of disturbances resulting from access operations precedent to the power-down operation also when the ferroelectric memory is repetitively subjected to a power-down operation before the access frequencies with respect to the memory cells 21 reach the prescribed number of times and a subsequent power-up operation. Consequently, the memory cells 21 can be prevented from disappearance of data resulting from accumulated disturbances.

According to the first embodiment, the ferroelectric memory reads and rewrites data from and in the memory cells 21 when the counter 5 detects that the total access frequency with respect to the memory cells 21 has reached the prescribed number of times in the power-down state, thereby more reliably preventing the memory cells 21 from disappearance of data resulting from disturbances.

According to the first embodiment, the ferroelectric memory is provided with the latch circuit portions 2b holding presence/absence of access operations with respect to the respective memory cell blocks 1a and the refresh control circuit 3 rewriting data in the memory cells 21 included in the memory cell block 1a corresponding to any latch circuit portion 2b holding presence (high-level data) of an access operation with respect to the corresponding memory cell block 1a, thereby restrictively rewriting data in the memory cells 21 provided in the memory cell block 1a subjected to the access operation. Therefore, the frequency of disturbances caused in already rewritten (refreshed) memory cells 21 due to disturbances resulting from a refresh operation of other memory cells 21 can be reduced as compared with a case of sequentially rewriting data in all memory cells 21 included in the memory cell array 1 in the refresh operation. Thus, the frequency of disturbances caused in the memory cells 21 in the refresh operation can be reduced.

According to the first embodiment, the refresh control circuit 3 is so formed as to rewrite data when the counter 5 detects that the total access frequency with respect to all memory cells 21 included in the memory cell array 1 has reached the prescribed number of times, whereby the ferroelectric memory can periodically refresh the memory cells 21 every constant access frequency dissimilarly to a case of detecting the access frequency with respect to each memory cell block 1a and refreshing the memory cells 21 every prescribed access frequency with respect to each memory cell block 1a. Thus, the ferroelectric memory can temporarily queue a normal access operation in a refresh operation every constant access frequency, whereby control of the ferroelectric memory can be simplified.

Second Embodiment

The structure of a ferroelectric memory according to a second embodiment of the present invention is now described with reference to FIG. 6.

Figure 6:
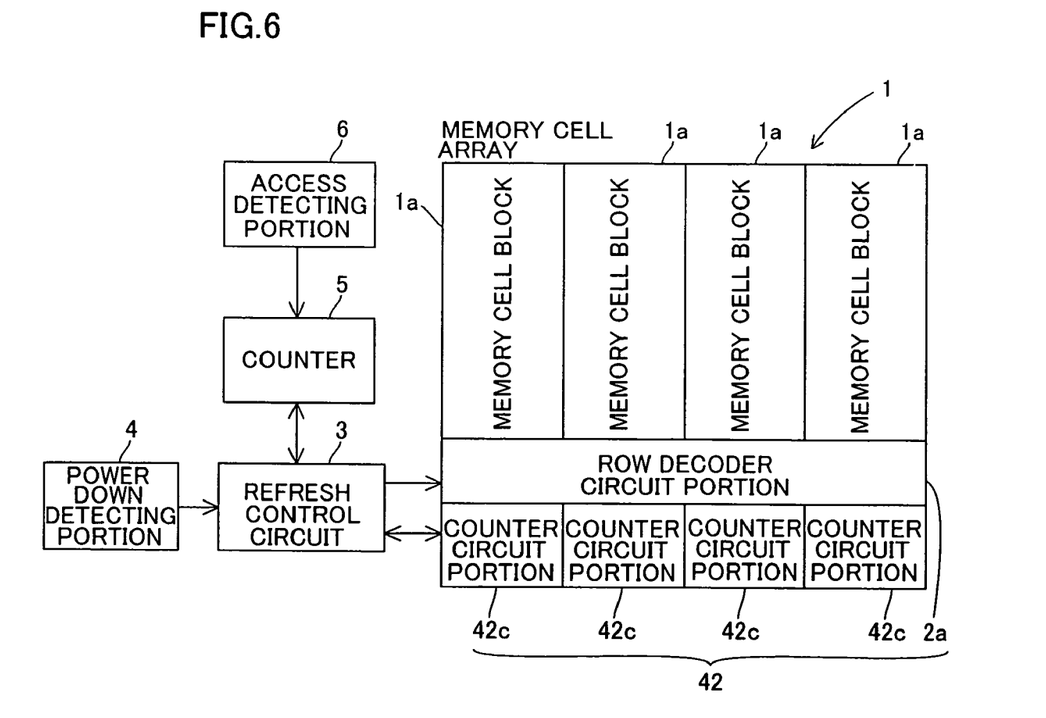
FIG. 6 is a block diagram for illustrating the structure of a ferroelectric memory according to a second embodiment of the present invention.

As shown in FIG. 6, the ferroelectric memory according to the second embodiment is provided with counter circuit portions 42c in correspondence to memory cell blocks 1a respectively, dissimilarly to the ferroelectric memory according to the aforementioned first embodiment. The counter circuit portions 42c are examples of the "second frequency detecting portion" in the present invention. The counter circuit portions 42c are provided for detecting access frequencies for the corresponding memory cell blocks 1a respectively. Each counter circuit portion 42c is so formed as to increase the corresponding access frequency by +1 every access operation with respect to the corresponding memory cell block 1a. According to the second embodiment, a row decoder 42 is provided with no latch circuit portions 2b (see FIG. 2), but is constituted of a row decoder circuit portion 2a and the four counter circuit portions 42c. The remaining structure of the ferroelectric memory according to the second embodiment is similar to that of the ferroelectric memory according to the aforementioned first embodiment.

Operations of the ferroelectric memory according to the second embodiment are now described with reference to FIG. 6. In the ferroelectric memory according to the second embodiment, a counter 5 detects access frequencies with respect to all memory cells 21, while the counter circuit portions 42c detect access frequencies for the corresponding memory cell blocks 1a respectively. Each counter circuit portion 42c increases the corresponding access frequency by +1 every access operation with respect to the corresponding memory cell block 1a.

When detecting that the access frequencies with respect to all memory cells 21 has reached a prescribed number of times, the counter 5 outputs a prescribed signal to a refresh control circuit 3. The refresh control circuit 3 outputs a control signal for starting a refresh operation to the row decoder 42 on the basis of the signal received from the counter 5. At this time, the refresh control circuit 3 outputs row addresses for selecting word lines WL requiring a refresh operation to the row decoder circuit portion 2a on the basis of the access frequencies for the memory cell blocks 1a detected by the counter circuit portions 42c respectively.

When the access frequency detected by any counter circuit portion 42c is less than a prescribed number (Nb), the refresh control circuit 3 outputs no row addresses of word lines WL included in the memory cell block 1a corresponding to the counter circuit portion 42c to the row decoder circuit portion 2a. When the access frequency detected by any counter circuit portion 42c is in excess of the prescribed number (Nb), on the other hand, the refresh control circuit 3 outputs the row addresses of word lines WL included in the memory cell block 1a corresponding to the counter circuit portion 42c to the row decoder circuit portion 1a. Thus, the ferroelectric memory can refresh the memory cells 21 of the memory cell block 1a exhibiting the accessed frequency exceeding the prescribed number (Nb) without refreshing the memory cells 21 of the memory cell block 1a exhibiting the access frequency less than the prescribed number (Nb). The ferroelectric memory according to the second embodiment refreshes (reads and rewrites data from and in) all memory cells 21 (see FIG. 1) in a power-down state, similarly to the ferroelectric memory according to the first embodiment. The remaining operations of the ferroelectric memory according to the second embodiment are similar to those of the ferroelectric memory according to the aforementioned first embodiment.

According to the second embodiment, as hereinabove described, the ferroelectric memory is provided with the counter circuit portions 42c detecting the access frequencies for the memory cell blocks 1a respectively and the refresh control circuit 3 rewriting data in all memory cells 21 included in the memory cell block 1a corresponding to any counter circuit portion 42c detecting that the access frequency with respect to the corresponding memory cell block 1a has reached the prescribed number (Nb), for restrictively rewriting data in the memory cells 21 provided in the memory cell block 1a requiring a refresh operation due to the access frequency reaching the prescribed number (Nb). Therefore, the frequency of disturbances caused in already rewritten (refreshed) memory cells 21 due to disturbances resulting from refresh operations of other memory cells 21 can be reduced as compared with a case of sequentially rewriting data in all memory cells 21 included in a memory cell array 1. Thus, the frequency of disturbances caused in the memory cells 21 in the refresh operation can be reduced.

The remaining effects of the ferroelectric memory according to the second embodiment are similar to those of the ferroelectric memory according to the aforementioned first embodiment.

Third Embodiment

The structure of a ferroelectric memory according to a third embodiment of the present invention is now described with reference to FIGS. 7 and 8.

Figure 7:
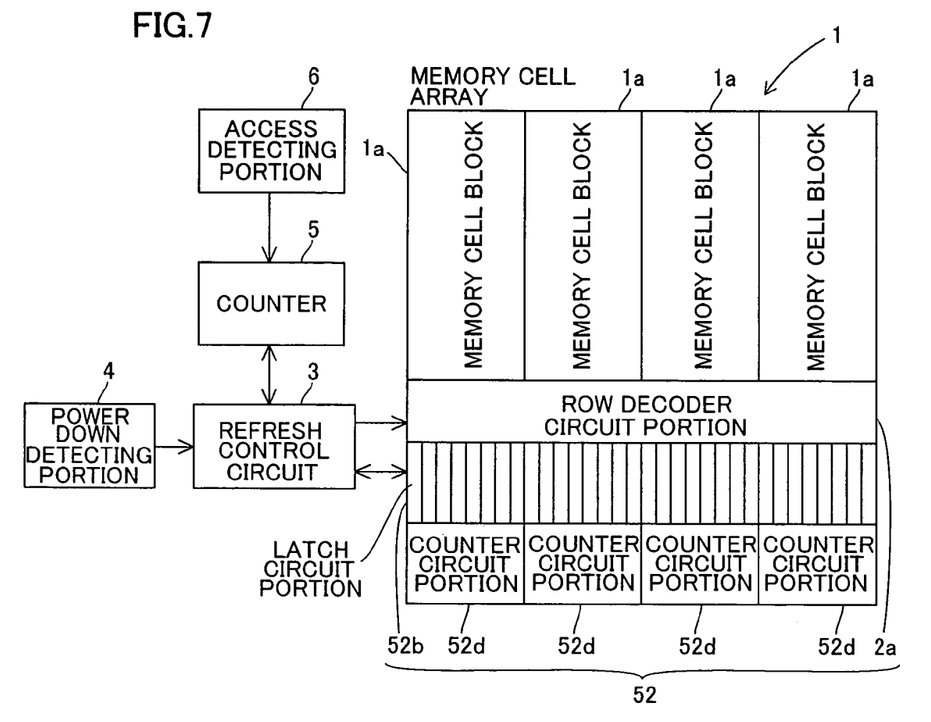
FIG. 7 is a block diagram for illustrating the structure of a ferroelectric memory according to a third embodiment of the present invention.
Figure 8:
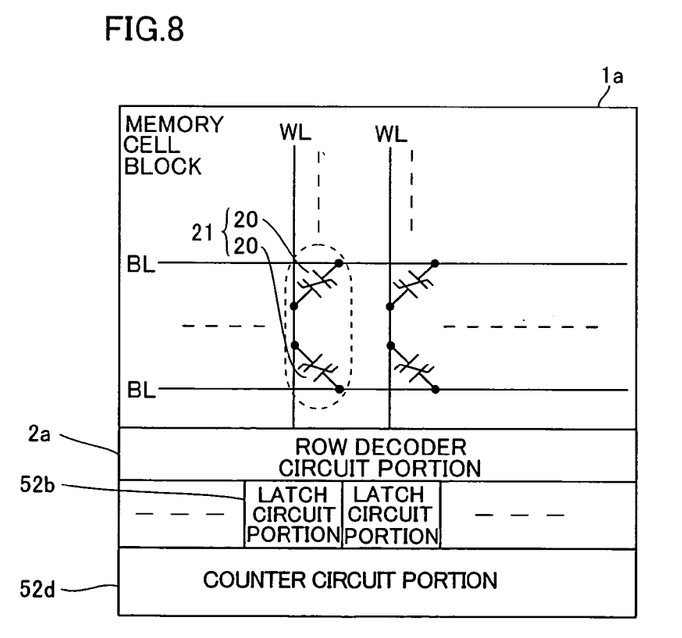
FIG. 8 is a diagram for illustrating the structures of a memory cell block and a row decoder of the ferroelectric memory according to the third embodiment shown in FIG. 7.

As shown in FIGS. 7 and 8, the ferroelectric memory according to the third embodiment has latch circuit portions 52b provided for word lines WL respectively, dissimilarly to the ferroelectric memory according to the aforementioned first embodiment. Therefore, eight latch circuit portions 52b are provided for each memory cell block 1a including eight word lines WL. The latch circuit portions 52b are examples of the "second holding portion" in the present invention. Each latch circuit portion 52b has a function of holding presence/absence of an access operation with respect to the corresponding word line WL. More specifically, each latch circuit portion 52b is so formed as to hold high-level data when the corresponding memory cell block 1a is accessed through the corresponding word line WL while holding low-level data when the corresponding memory cell block 1a is not accessed through the corresponding word line WL.

The ferroelectric memory according to the third embodiment further has counter circuit portions 52d for detecting access frequencies for the memory cell blocks 1a respectively. The counter circuit portions 52d are examples of the "second frequency detecting portion" in the present invention. These counter circuit portions 52d are provided for the respective memory cell blocks 1a. Each counter circuit portion 52d is so formed as to increase the corresponding access frequency by +1 every access operation with respect to the corresponding memory cell bock 1a. A row decoder 52 is constituted of a row decoder circuit portion 2a, 32 latch circuit portions 52b and four counter circuit portions 52d. The remaining structure of the ferroelectric memory according to the third embodiment is similar to that of the ferroelectric memory according to the aforementioned first embodiment.

Operations of the ferroelectric memory according to the third embodiment of the present invention are now described with reference to FIGS. 7 and 8. When any memory cells 21 are accessed through the corresponding word line WL, the ferroelectric memory according to the third embodiment converts data held in the latch circuit portion 52b corresponding to the word line WL to a high level. Every time any memory cells 21 are accessed through the corresponding word line WL, the counter circuit portion 52d corresponding to the memory cell block 1a possessing the word line WL increases the access frequency by +1.

If the eight latch circuit portions 52b corresponding to any memory cell block 1a hold high-level data when the corresponding counter circuit portion 52d detects that the access frequency with respect to the memory cell block 1a has reached a prescribed number (Nc), the ferroelectric memory according to the third embodiment converts and fixes the data held by the eight latch circuit portions 52b to low levels. If the eight latch circuit portions 52b corresponding to any memory cell block 1a include those holding low-level data and those holding high-level data when the corresponding counter circuit portion 52d detects that the access frequency with respect to the memory cell block 1a has reached the prescribed number (Nc), on the hand, the ferroelectric memory converts and fixes the data held by the eight latch circuit portions 52b to high levels.

When detecting that access frequencies with respect to all memory cells 21 has reached a prescribed number of times, a counter 5 outputs a prescribed signal to a refresh control circuit 3. The refresh control circuit 3 outputs a control signal for starting a refresh operation to the row decoder 52 on the basis of the signal received from the counter 5. According to the third embodiment, the refresh control circuit 3 outputs row addresses for selecting word lines WL requiring a refresh operation to the row decoder circuit portion 2a on the basis of the data held in the latch circuit portions 52b at this time.

When the eight latch circuit portions 52b corresponding to a prescribed memory cell block 1a hold high-level data, the refresh control circuit 3 outputs row addresses of all word lines WL included in the memory cell block 1a to the row decoder circuit portion 2a. When the eight latch circuit portions 52b corresponding to the prescribed memory cell block 1a hold low-level data, on the other hand, the refresh control circuit 3 does not output row addresses of all word lines WL included in the memory cell block 1a to the row decoder circuit portion 2a. Thus, the ferroelectric memory performs no refresh operation on all memory cells 21 included in the prescribed memory cell block 1a when the memory cell block 1a is accessed through all of the eight word lines WL included therein and when the memory cell block 1a is not accessed through the eight word lines WL.

When the eight word lines WL included in the prescribed memory cell block 1a include accessed and unaccessed word lines WL, on the other hand, the ferroelectric memory refreshes all memory cells 21 included in the memory cell block 1a. The ferroelectric memory performs no refresh operation on all memory cells 21 included in the memory cell block 1a accessed through all of the eight word lines WL included therein for the following reason: The memory cells 21 included in the memory cell block 1a accessed through all of the eight word lines WL are conceivably so uniformly accessed that the same are conceivably relatively less influenced by disturbances. According to the third embodiment, the ferroelectric memory refreshes (reads and rewrites data from and in) all memory cells 21 (see FIG. 8) in a power-down state, similarly to the ferroelectric memory according to the first embodiment. The remaining operations of the ferroelectric memory according to the third embodiment are similar to those of the ferroelectric memory according to the aforementioned first embodiment.

According to the third embodiment, as hereinabove described, the ferroelectric memory converts and fixes data held in the eight latch circuit portions 52b to low levels if all of the eight latch circuit portions 52b hold high-level data when the corresponding counter circuit portion 52d detects that the access frequency with respect to the memory cell block 1a has reached the prescribed number (Nc), so that the refresh control circuit 3 does not output the row addresses of the word lines WL included in the memory cell block 1a to the row decoder circuit portion 2a. Therefore, the ferroelectric memory can make the refresh control circuit 3 perform neither read nor rewrite operation (refresh operation) on the memory cell block 21a having the memory cells 21 relatively uniformly accessed through all of the eight word lines WL. Thus, the ferroelectric memory can make the refresh control circuit 3 perform neither read nor rewrite operation on the memory cells 21 of the memory cell block 1a conceivably less influenced by disturbances due to relatively uniform access operations with respect to the memory cells 21 in a refresh operation. Therefore, the frequency of read and rewrite operations through the refresh operation can be so reduced that the frequency of disturbances caused in the memory cells 21 in the refresh operation can be reduced also according to this structure.

The remaining effects of the ferroelectric memory according to the third embodiment are similar to those of the ferroelectric memory according to the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while each of the above embodiments has been described with reference to a ferroelectric memory employed as an exemplary memory according to the present invention, the present invention is not restricted to this but is also applicable to a nonvolatile memory other than the ferroelectric memory.

Figure 9:
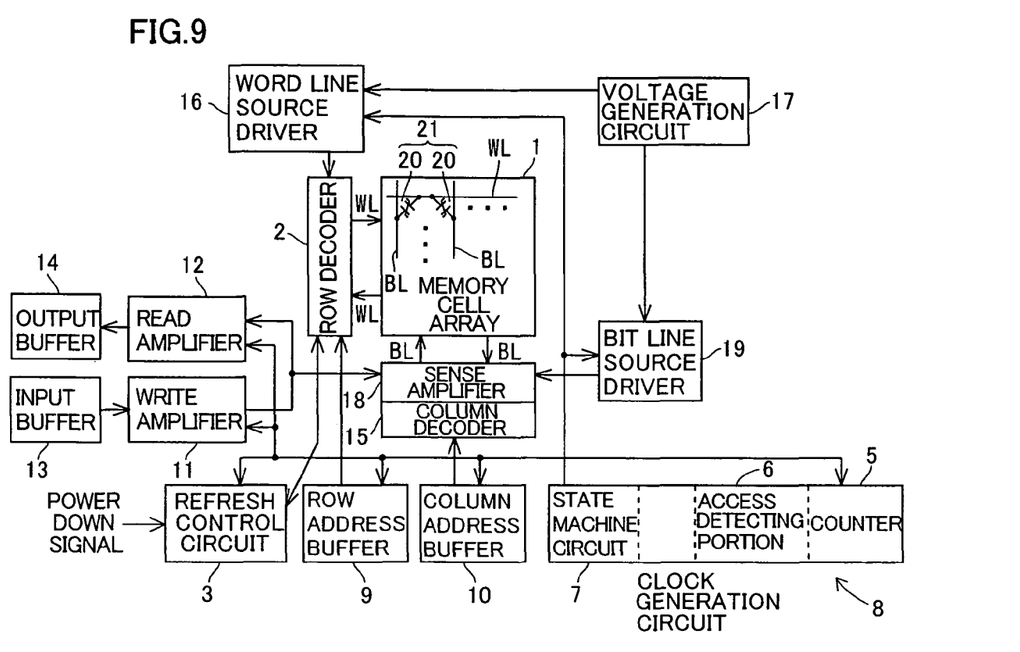
FIG. 9 is a block diagram for illustrating the overall structure of a ferroelectric memory according to a modification of the present invention.
Figure 10:
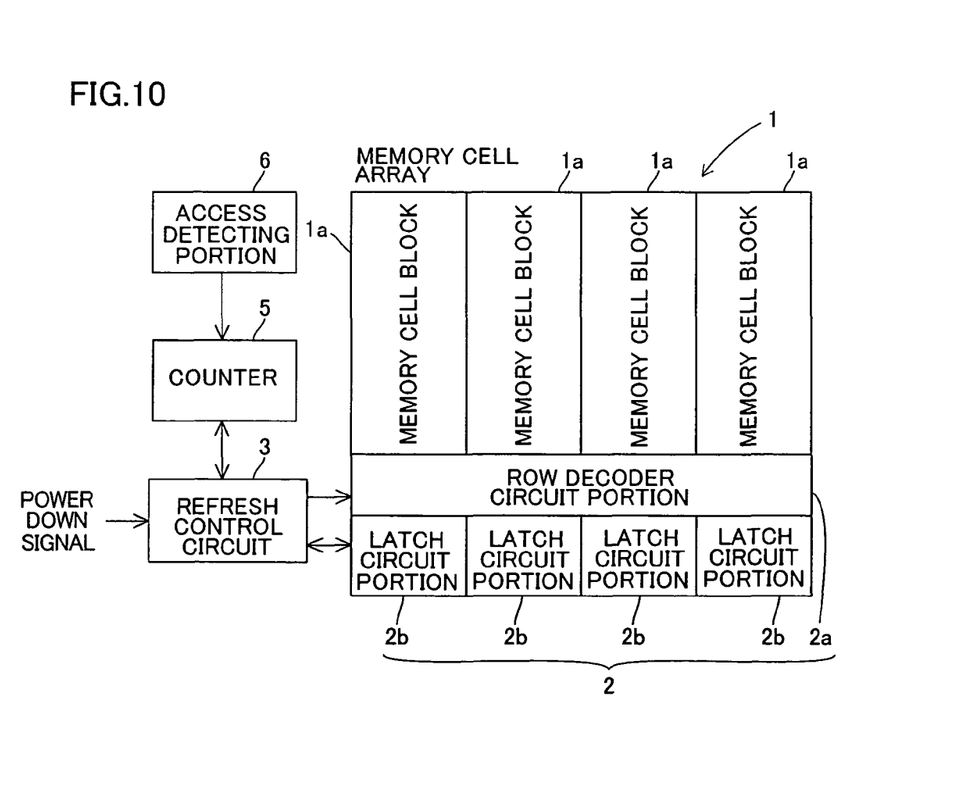
FIG. 10 is a block diagram for illustrating the detailed structure of the ferroelectric memory according to the modification of the present invention shown in FIG. 9.

While the power-down detecting portion provided in the memory detects the power-down state and outputs the activation signal to the refresh control circuit for starting the refresh operation in the power-down state in the ferroelectric memory according to each of the aforementioned embodiments, the present invention is not restricted to this but the ferroelectric memory may alternatively start the refresh operation in the power-down state according to a structure other than the above. For example, a refresh control circuit 3 may be so formed as to receive a power-down signal generated when a user pushes a power switch for starting a refresh operation on the basis of the power-down signal as shown in FIGS. 9 and 10, without the power-down detecting portion 4 (see FIGS. 1 and 2) provided in the ferroelectric memory according to the aforementioned first embodiment. According to this structure, the refresh control circuit 3 can read and rewrite data from and in memory cells 21 in a power-down state with no circuit for detecting the power-down state, whereby the circuit structure of the memory can be simplified. Further alternatively, a power-down detecting portion provided on the outside of the memory may detect a power-down state and output a prescribed signal to a refresh control circuit, so that the refresh control circuit starts a refresh operation in the power-down state.

While eight word lines are provided for each memory cell block in each of the aforementioned embodiments, the present invention is not restricted to this but word lines may be provided in a prescribed number other than eight for each memory cell block.

While the ferroelectric memory according to the aforementioned third embodiment converts and fixes data held in the latch circuit portions 52b to high or low levels on the basis of low- or high-level data held in the latch circuit portions 52b corresponding to the prescribed memory cell block 1a when the corresponding counter circuit 52d detects that the access frequency with respect to the memory cell block 1a has reached the prescribed number (Nc), the present invention is not restricted to this but a latch circuit may alternatively be separately provided for each memory cell block 1a so that the ferroelectric memory converts and fixes data held by the latch circuit on the basis of high- or low-level data held in the aforementioned latch circuit portions 52b. When the refresh control circuit 3 outputs row addresses to the row decoder circuit portion 2a, the ferroelectric memory may decide row addresses to be output and not output to the row decoder circuit portion 2a on the basis of the data held in the aforementioned separately provided latch circuit.

What is claimed is:

1. A memory, comprising:
a memory cell array including a plurality of memory cell blocks, wherein each memory cell block has a plurality of non-volatile memory cells;
an access operation detecting portion configured to detect an access operation for a prescribed number of the memory cells; and
a refresh portion configured to rewrite data in the memory cells, to read data from and rewrite data to the memory cells in a power-down state, and to read data from and rewrite data to the memory cells included in at least one of the memory cell blocks of the prescribed number of memory cells based on at least the detected access operation.

2. The memory of claim 1, further comprising a power-down detecting portion configured to detect the power-down state, wherein in response to the power-down detecting portion detecting the power-down state, the refresh portion is further configured to read data from and rewrite data to the memory.

3. The memory of claim 2, wherein the power-down detecting portion is further configured to output an activation signal to drive the refresh portion in response to detection of the power-down state.

4. The memory of claim 1, further comprising a row decoder configured to drive a word line, wherein the refresh portion is further configured to output a control signal to the row decoder in the power-down state and wherein the control signal is configured to start a refresh operation including a read operation and a rewrite operation.

5. The memory of claim 1, wherein:
the memory is configured to generate a power-down signal to be inputted to the refresh portion in response to the power-down state; and
the refresh portion is further configured to read data from and rewrite data to the memory based on the power-down signal.

6. The memory of claim 1, further comprising:
a first access frequency-detecting portion configured to detect an access frequency of a particular memory cell, wherein the refresh portion is further configured to read data from and rewrite data to the particular memory cell if at least the first access frequency-detecting portion detects that a total access frequency of the particular memory cell reaches a prescribed threshold.

7. The memory of claim 1, wherein:
the access operation detecting portion comprises a first holding portion configured to hold a presence/absence of the access operation for each of the memory cell blocks; and
the refresh portion is further configured to read data from and rewrite data to the memory cells included in the at least one memory cell block if at least the first holding portion holds the presence of the access operation of the corresponding at least one memory cell block.

8. The memory of claim 7, wherein the first holding portion is provided to each of the memory cell blocks.

9. The memory of claim 1, wherein:
the access operation detecting portion comprises a second access frequency-detecting portion configured to detect an access frequency for each of the memory cell blocks; and
the refresh portion is further configured to read data from and rewrite data to the memory cells included in the at least one memory cell block if at least the second access frequency-detecting portion detects that the access frequency of the corresponding memory cell block has reached a prescribed threshold.

10. The memory of claim 1, further comprising a plurality of word lines connected to the prescribed number of memory cells respectively, wherein:
the access operation detecting portion includes a second holding portion configured to hold a presence/absence of an access operation for each of the word lines; and
the refresh portion is further configured to read data from and rewrite data to the memory cells included in the at least one memory cell block corresponding to at least one of the word lines if at least the second holding portion holds the presence of the access operation of the corresponding at least one word line.

11. The memory of claim 10, wherein the second holding portion is provided to each of the word lines.

12. The memory of claim 10, further comprising a second access frequency-detecting portion configured to detect an access frequency for each of the memory cell blocks and to change the second holding portions corresponding to the at least one memory cell block into states that hold an absence of access operations if all the second holding portions corresponding to the at least one memory cell block hold a presence of access operations if the second access frequency-detecting portion detects that the access frequency of the at least one memory cell block has reached a prescribed threshold, wherein the refresh portion is configured to neither read data from nor rewrite data to the memory cells included in the at least one memory cell block if all the second holding portions corresponding to the at least one memory cell block hold an absence of access operations.

13. The memory of claim 12, wherein the refresh portion is configured to read data from and rewrite data to the memory cells included in the at least one memory cell block if the second holding portions corresponding to the at least one memory cell block include both the second holding portion that holds the presence of an access operation and the second holding portion that holds the absence of an access operation if the second access frequency-detecting portion detects that an access frequency of the at least one memory cell block has reached the prescribed threshold.

14. The memory of claim 12, wherein the second access frequency-detecting portion is provided to each of the memory cell blocks.

15. The memory according to claim 1, wherein the memory cell comprises a ferroelectric capacitor having a ferroelectric film.

16. A memory apparatus, comprising:
a memory cell array including a plurality of memory cell blocks, wherein each memory cell block has a plurality of non-volatile memory cells;
an access operation detecting portion including a first holding portion configured to hold a presence/absence of an access operation for each of the memory cell blocks; and
refresh portion means for rewriting data in a memory cell of the plurality of non-volatile memory cells, wherein the refresh portion means reads data from and rewrites data to the memory cell of the plurality of non-volatile memory cells in a power-down state.

17. The memory apparatus of claim 16, further comprising power-down detecting means for detecting the power-down state, wherein the refresh portion means reads data from and rewrites data to the memory cell of the plurality of non-volatile memory cells if the power-down detecting means detects the power-down state.

18. The memory apparatus of claim 16 wherein the access operation detecting portion is configured to detect the access operation for a prescribed number of the memory cells, and wherein the refresh portion means reads data from and rewrites data to the memory cells included in at least one of the memory cell blocks possessing the prescribed number of memory cells based on at least a detection of the access operation.

19. The memory apparatus of claim 16, wherein the non-volatile memory cells comprise ferroelectric memory cells.

20. An apparatus, comprising:
a non-volatile memory configured to enter a power-down state and including a plurality of memory cell blocks
an access operation detection portion including a first holding portion means for holding a presence/absence of an access operation for each of the memory cell blocks; and
a refresh control circuit coupled to the non-volatile memory and configured to read data from and rewrite data to a memory cell of the non-volatile memory in the power-down state.

21. The apparatus of claim 20, wherein:
the non-volatile memory is further configured to generate a power-down signal; and
the non-volatile memory is further configured to input the generated power-down signal to the refresh control circuit to initiate a refresh operation in response to entry into the power-down state, wherein the refresh control circuit is further configured to initiate the refresh operation to read data from and rewrite data to the memory cell based on the power-down signal.

22. The apparatus of claim 20, further comprising:
an access detection portion configured to detect an access frequency of the memory cell, wherein the refresh control circuit is further configured to read data from and rewrite data to the memory cell if the access detection portion detects that a total access frequency of the memory cell has reached a prescribed threshold.

23. The apparatus of claim 20, wherein the non-volatile memory comprises a ferroelectric memory.

* * * * *

UNITED STATES PATENT AND TRADEMARK OFFICE
CERTIFICATE OF CORRECTION

| | | |
|---|---|---|
| PATENT NO. | : 7,933,161 B2 | Page 1 of 1 |
| APPLICATION NO. | : 11/509057 | |
| DATED | : April 26, 2011 | |
| INVENTOR(S) | : Miyamoto et al. | |

It is certified that error appears in the above-identified patent and that said Letters Patent is hereby corrected as shown below:

Title page, item (57), under "Abstract", in Column 2, Line 3, delete "nonvolatile" and insert -- non-volatile --.

Column 18, line 19, in Claim 20, delete "blocks" and insert -- blocks; --.

Signed and Sealed this
Eighth Day of November, 2011

David J. Kappos
*Director of the United States Patent and Trademark Office*